United States Patent [19]

Narasimhan et al.

[11] Patent Number: 5,287,017

[45] Date of Patent: Feb. 15, 1994

[54] PROGRAMMABLE LOGIC DEVICE MACROCELL WITH TWO OR ARRAY INPUTS

[75] Inventors: Varadarajan L. Narasimhan; Kurt P. Douglas; Paul S. Zagar, all of Boise, Id.

[73] Assignee: Micron Technology, Inc., Boise, Id.

[21] Appl. No.: 884,489

[22] Filed: May 15, 1992

[51] Int. Cl.$^5$ .......................................... H03K 19/173
[52] U.S. Cl. ..................................... 307/465; 307/475
[58] Field of Search ................................. 307/465, 475

[56] References Cited

U.S. PATENT DOCUMENTS

| | | |
|---|---|---|
| 3,287,702 | 11/1966 | Boick, Jr. et al. |
| 3,287,703 | 11/1966 | Slotnick . |
| 3,296,426 | 1/1967 | Bau . |
| 3,313,926 | 4/1967 | Minnick . |
| 3,423,646 | 1/1969 | Cubut et al. ............ 340/825.83 |
| 3,462,742 | 8/1969 | Miller et al. . |
| 3,473,160 | 10/1969 | Wahestiom . |
| 3,514,543 | 11/1970 | Crawford et al. ............ 340/324 |
| 3,535,498 | 10/1970 | Smith, Jr. . |
| 3,566,153 | 2/1971 | Spencer, Jr. ............... 307/468 |
| 3,602,733 | 8/1971 | Aoke ........................... 307/209 |
| 3,702,985 | 11/1972 | Probsting ................. 340/166 R |
| 3,737,866 | 6/1973 | Gruner ........................ 340/172.5 |
| 3,742,242 | 7/1973 | Preel ............................ 307/209 |
| 3,757,306 | 9/1973 | Boone .......................... 340/172.5 |
| 3,769,525 | 10/1973 | Foss et al. .................... 307/254 |
| 3,774,171 | 11/1973 | Regitz ........................... 365/105 |
| 3,795,901 | 3/1974 | Boehm et al. ............... 340/172.5 |
| 3,798,606 | 3/1974 | Henle et al. ................. 340/172.5 |
| 3,803,587 | 4/1974 | Mead ............................ 340/336 |
| 3,816,725 | 6/1974 | Greer ............................ 364/716 |
| 3,818,252 | 6/1974 | Chiba et al. ................. 307/303 |
| 3,818,452 | 6/1974 | Greer ......................... 340/825.83 |
| 3,832,489 | 8/1974 | Krishna ......................... 178/71 |
| 3,849,638 | 11/1974 | Greer ........................... 364/716 |
| 3,906,255 | 9/1975 | Mensch, Jr. ................. 307/448 |
| 3,912,947 | 10/1975 | Buchanan ..................... 307/269 |
| 3,924,243 | 12/1975 | Vermeulen .................... 364/900 |
| 3,967,059 | 6/1976 | Moore, III et al. ............ 178/58 |
| 3,974,366 | 8/1976 | Hebenstreit .................. 364/716 |
| 3,979,730 | 9/1976 | Bennett et al. ................ 364/200 |
| 3,983,538 | 9/1976 | Jones ............................ 364/716 |
| 3,987,286 | 10/1976 | Homlager ..................... 235/152 |

(List continued on next page.)

FOREIGN PATENT DOCUMENTS 1444084 7/1976 United Kingdom .

OTHER PUBLICATIONS

PAL/PLE Programmable Logic Handbook Monolithic Memories, Inc. 2175 Mission College Blvd. Santa Clara, Calif. 95054, 1985.
J. E. Elliott, et al., "Array Logic Processing", IBM, Tech. Disclosure Bulletin, vol. 18, No. 21, Jul. 1973, pp. 219-220.
H. Flersher et al, "An Introduction to Array Logic" IBM J. Research & Development, Mar. 1975, pp. 98-104.
Jones, "Array Logic Macros" IBM J. Research and Development, Mar. 1975, pp. 120-126.
Andres, "MOS Programmable Logic Arrays" A Texas Instrument Application Report, Oct. 1970, pp. 1-13.
Barna et al, Integrated Circuits in Digital Electronics John Wiley & Sons 1973, pp. 412-419 and 84-91 and FIGS. 11-34.
Wood "High-Speed Dynamic Programmable Logic Array Chip" IBM J. Res. Develop., Jul. 1975, pp. 379-381.
Boysel, "Memory on a Chip: a step toward large-scale Integration" Electronics, Feb. 6, 1967, pp. 93-97.
Wiekes et al, "The Design of the Control Unit of an (List continued on next page.)

Primary Examiner—Edward P. Westin
Assistant Examiner—Jon Santamauro
Attorney, Agent, or Firm—Michael W. Starkweather

[57] ABSTRACT

A programmable logic device (PLD) is disclosed, which can efficiently, in a realestate sense, emulate a Mealy state machine. Specifically, there is a PLD which has macrocells which accept signals from two separate logical OR arrays. Where the first array and macrocell produces a latched output signal and the second array and macrocell circuit produces a non-latched output signal.

11 Claims, 8 Drawing Sheets

U.S. PATENT DOCUMENTS

| | | | |
|---|---|---|---|
| 3,987,410 | 10/1976 | Beausoleil et al. | 340/146.3 |
| 3,990,045 | 11/1976 | Beausoleil et al. | 340/146.3 |
| 4,034,349 | 7/1977 | Momaco et al. | 364/200 |
| 4,034,356 | 7/1977 | Howley et al. | 340/173 |
| 4,037,089 | 7/1977 | Horninger | 235/152 |
| 4,044,312 | 8/1977 | D'Ortenzio | 328/165 |
| 4,078,259 | 3/1978 | Soulsby et al. | 364/900 |
| 4,091,359 | 5/1978 | Rossler | 340/166 R |
| 4,093,998 | 6/1978 | Miller | 364/900 |
| 4,107,785 | 8/1978 | Seipp | 364/900 |
| 4,124,899 | 11/1978 | Birkner et al. | |
| 4,128,873 | 12/1978 | Lamlaux | 364/200 |
| 4,218,740 | 8/1980 | Bennett et al. | 364/200 |
| 4,422,072 | 12/1983 | Cavlan | 340/825.87 |
| 4,554,640 | 11/1985 | Wong et al. | 364/716 |
| 4,717,912 | 1/1988 | Hawey et al. | 340/825.87 |
| 4,742,252 | 5/1988 | Agrawal | 307/465 |
| 4,758,746 | 7/1988 | Birkner et al. | 307/465 |
| 4,763,020 | 8/1988 | Takata et al. | 307/465 |
| 4,771,285 | 9/1988 | Agrawal et al. | 340/825.83 |
| 4,789,951 | 12/1988 | Birkner et al. | 364/716 |
| 4,847,612 | 7/1989 | Kaplinsky | 340/825.8 |
| 4,918,641 | 4/1990 | Jigour et al. | 307/465 |
| 4,963,768 | 10/1990 | Agrawal et al. | 307/465 |
| 4,967,107 | 10/1990 | Kaplinsky | 307/465 |
| 5,012,135 | 4/1991 | Kaplinsky | 307/465 |
| 5,027,011 | 6/1991 | Steele | 307/465 |
| 5,027,315 | 6/1991 | Agrawal et al. | 307/465 |
| 5,028,821 | 7/1991 | Kaplinsky | 307/465 |
| 5,055,718 | 10/1991 | Galbraith et al. | 307/465 |
| 5,059,828 | 10/1991 | Tanagawa | 307/465 |
| 5,121,006 | 6/1992 | Pedersen | 307/465 |
| 5,136,188 | 8/1992 | Ha et al. | 307/465 |
| 5,148,391 | 9/1992 | Zagar | 365/96 |
| 5,166,556 | 11/1992 | Hsu et al. | 307/465 |
| 5,168,177 | 12/1992 | Shankar et al. | 307/465 |
| 5,220,215 | 6/1993 | Douglas et al. | 307/465 |

OTHER PUBLICATIONS

Electronic Digital Computer" The Institution of Electrical Engineers, Jun. 1957, pp. 121-128.

Mrazek, "PLAS Replace ROMs for Logic Designs" Electronic Design Oct. 25, 1973, pp. 66-70.

Howley et al. "Programmable Logic Array Decoding Technique" IBM Tech. Disclosure Bulletin, vol. 17, N. 10, Mar. 1975-p. 2988.

Hemel "The PLA: a different kind of ROM" Electronic Design, Jan. 5, 1976, pp. 78-84.

Kidder, The Soul of a New Machine, 1982, pp. 118-128 and 268-269.

National Semiconductor Inc. "Data update MOS." Aug. 1972, pp. 86 and 87.

Blakeslee, Digital Design With Standard MSI and LSI, John Wiley and Sons, 1975, pp. 67-77, 94-99, and 104-105.

PAL Handbook, Monolithic Memories, Inc. 1978 p. N/A.

Hurtin et al, "A Simplified Summation Array for Cellular Logic Modules" IEEE Trans. on Computers, Feb. 1974, pp. 203-206.

Programmable Logic-A Basic Guide for the Designer, Data I/O Corp. 1983-pp. 20-25.

The TTL Data Book for Design Engineers, Texas, Instruments Inc, 1973, pp. 295, 303, 473, 458 and 480.

Monolithic Memories Inc. Form 10-K, Oct. 3, 1982 Annual Report Pursuant to Section 13 or 15(d) of the Securities Exchange Act of 1934.

"The Role of Software in the Growth of PLDs" The Technology Research Group Letter, vol. 1, N. 13, Nov. 1985, p. 3.

Teil et al. "A Logic Minimizer for VLSI PLA Design" ACM IEEE Ninteenth Design Automation Conf. Proceedings, Jun. 1982, pp. 156-162.

Maarrin, "Programmable Logic Devices Gain Software Support" EDN Feb. 9, 1984, pp. 67-74.

Cole et al. "Next Generation Programmable Logic" Wescon/84. Professional Program Session Record, Session 19.

Monolithic Memories Annual Report 1981, Letter to Shareholders, p. 2.

Semicustom IC Update, Field Programmable Logic Devices, "Visa from the Valley", Hambrecht & Grest Inc., vol. 3, No. 1, Mar. 1986, pp. 4-7.

Phelps, Institutional Research Report on Monolithic Memories, Inc., A Publication of Woodman Kirkpatrick & Gilbrath, Aug. 30, 1984.

Wood, "High-Speed Dynamic Programmable Logic Array Chip" IBM J. Res. Develop, Jul. 1975, pp. 379-381.

Cavlan et al. "Field PLAS Simplify Logic Designs" reprinted from Electronic Design, Sep. 1, 1975.

Signetics, Bipolar and MOS Memory Data Manual Signetics Inc., pp. 156-165, Jan. 1979.

Dorman "PLAS or MPs at times they compete at times they cooperate" Electronic Design, 18, Sep. 1, 1976, pp. 24-30.

Elliot et al, "Array Logic Processing" IBM Tech. Disclosure Bulletin, vol. 16, No. 2, Jul. 1973, pp. 586-587.

MacWorld, The MacIntosh Magazine, May-Jun. 1984.

Use of Laser Mechanism in printers breaks Price and Maintenance Barriers, Jan. 15, 1985, p. 277.

MODE 0

MODE 1

MODE 2

MODE 3

MODE 4

MODE 5

MODE 6

MODE 7

PROGRAMMABLE LOGIC DEVICE MACROCELL WITH TWO OR ARRAY INPUTS

CROSS-REFERENCES TO RELATED AND COPENDING APPLICATIONS

U.S. patent application Ser. No. 07/817,167, filed 1/6/92, is a CMOS logic cell for high-speed, zero-power programmable array logic devices, having common assignee with the present invention.

U.S. patent application Ser. No. 07/865,007, filed 4/8/92, is a field programmable logic array with speed optimized architecture, having common assignee with the present invention.

U.S. patent application Ser. No. 884,104, filed 5/15/92, is a field programmable logic array with two OR arrays, having common assignee with the present invention.

U.S. patent application Ser. No., 883,076, filed 5/15/92, is a programmable logic device macrocell with an exclusive feedback line and an exclusive external input line, having common assignee with the present invention.

U.S. patent application Ser. No., 883,759, filed 5/15/92, is a field programmable logic device macrocell with an exclusive feedback line and an exclusive external input line, having common assignee with the present invention.

U.S patent application Ser. No., 884,505, filed 5/15/92, is a field programmable logic device macrocell with an exclusive feedback line and an exclusive external input line for a combinatorial mode and accommodating two separate programmable or planes, having common assignee with the present invention.

U.S patent application Ser. No. 883,843, filed 5/15/92, is a field programmable logic device macrocell with an exclusive feedback line and an exclusive external input line for a state counter or registered sum-of-products, having common assignee with the present invention.

U.S. patent application Ser. No. 883,078, filed 5/15/92, is field programmable logic device macrocell with an exclusive feedback line and an exclusive external input line for registered and combinatorial modes using a dedicated product term for control, having common assignee with the present invention.

FIELD OF THE INVENTION

This invention relates to field programmable logic arrays (FPLA); particularly, an FPLA having macrocells that accommodate outputs from two fully programmable OR arrays which are utilized for creating efficient Mealy state machine architecture and other architecture using feedback signals.

BACKGROUND OF THE INVENTION

The introduction of programmable logic devices (PLD) was a true revolution in the hardware design world. It enabled engineers to shrink circuits requiring several devices onto a single device thus simplifying their designs while saving space and power. Traditionally, PLDs have been used in combinational circuits such as address decoders as well as sequential circuits such as bus arbitration schemes. During the last few years, advances and improvements in PLD architectures enabled the devices to grow more complex while addressing the never-ending quest for higher density and faster speeds. Despite these improvements, engineers still face certain problems and limitations when implementing state machine designs with PLDs.

A typical programmable logic device is composed of a user-programmable AND array, a fixed or programmable OR gates or arrays, followed by macrocells comprising output registers, feedback paths to the programmable AND array, and output pads. The existence of a feedback path from the output registers to the AND array makes PLDs ideal candidates for state machine implementations.

There are several basic categories of state machines such as Mealy and Moore machines. FIG. 1 illustrates the basics of a Mealy state machine as follows: a logic circuit 10, inputs 12 from the outside world, current state inputs 14, outputs 16, and next state outputs 18 leading to flip-flops 20.

The main characteristic of the Mealy is that its outputs 16, to the outside world, are a function of both inputs 12 and inputs 14.

It is possible to implement any of the state machines in a PLD; however, there are inefficiencies in implementing state machines with current PLDs.

If a Mealy machine is implemented on a standard PLD, a wasteful two macrocells would be required — one per state register and one for each output.

The use of an extra macrocell is not an efficient use of the device's realestate resources and is fairly limiting in application. For example, a state machine with four outputs would be constrained to having no more than four state variables in an eight macrocell PLD.

FIG. 2 illustrates that if a Mealy machine is implemented on a standard PLD, a wasteful two macrocells would be required. In operation, inputs 28, lead to both logic circuit 30 and 40, comprising an AND and OR matrix. Logic circuit 30 generates the next state then outputs to register 32, working as memory elements. The output of register 32 is the current state, which is then input to logic circuits 30 and 40. Logic circuit 40 has the current state and inputs 28 as inputs for decoding and then outputting over pads 44. The current state is also used to generate the next state when inputted to circuit 30.

Inefficiencies occur in that pads 34 are by-passed and not used and that flip-flops 42 are likewise by-passed and not used. Specifically, both macrocell 33 and 43 are under-utilized.

As a solution to the aforementioned state machine problem, a two-OR array circuit was designed. One array generates the next state and utilizes the register. A second array calculates the outputs utilizing the current state and the inputs. FIG. 3 is a block diagram of a two OR array PLD utilized for implementing a Mealy state machine, and having the following elements: input 50, programmable logical AND array 52, a first programmable logical OR array 54, macrocell 55 having flip-flop 56 and output pad 62, feedback line 58, and a second logical OR array 60.

One skilled in the art will appreciate the advantage of this architecture. Specifically, by implementing two OR arrays, which have a common output pad, the first OR will calculate the current state of the Mealy machine, and the second OR will calculate the outputs in response to the current state and the inputs. Thus, implementing a Mealy state machine by utilizing only one flip-flop and one output pad per state register of the machine.

Therefore, a need exists for a macrocell which can coordinate the outputs from two logical OR arrays for implementing an efficient Mealy state machine, and specifically, the efficient use of output pads and registers/flip-flops.

SUMMARY OF THE INVENTION

The present invention provides an efficient macrocell for an IC which implements a Mealy state machine with efficient use of its output pads and flip-flops. Specifically, the IC utilizes two programmable OR arrays which share a common macrocell having an output pad, and a storage register. Furthermore, of the two OR arrays, a first OR array is coupled to the register which is needed for generating a next state of a mealy state machine, whereas the second OR array is coupled to both the inputs and current state to generate the Mealy machine outputs.

Besides having the capability of implementing an efficient Mealy machine, the two OR array architecture is configurable to several different modes of operation.

Features of the present invention will become clear from the following detailed description of the invention, taken in conjunction with the accompanying drawings.

DETAILED DESCRIPTION OF THE ILLUSTRATED EMBODIMENT

Incorporated Material

For the purpose of providing background material which may in some respects illustrate the state of the art, the following books are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872 .L64 P44 1991.

The following U.S. patents and applications are herein incorporated by reference: U.S. Pat. No. 3,423,646, is a computer logic device consisting of an array of tunneling diodes, isolators and short circuits. U.S. Pat. No. 3,566,153, is a programmable sequential logic device. U.S. Pat. No. 4,124,899, is a programmable array logic circuit. U.S. Pat. No. 4,717,912, an apparatus for producing any one of a plurality of signals at a single output. U.S. Pat. No. 4,758,746, is a programmable logic array with added array of gates and added output routing flexibility.

Definitions

It is noted that in the following discussions, the term 'array' is often used as referring to groupings or divisions of logical OR gates. Although, technically, these groupings taken together form a single logical OR array. Tri-state, is another name for a three-state or 3-state device. Additionally, flip-flops are also referred to as registers, latches, or memory elements. Lastly, a macrocell is defined as an output circuit coupled to the end of the logic circuits and containing multiplexers, buffers, registers, etc., and an output driver. Lastly, when discussing or illustrating output pads, drivers or buffers are not always stated or illustrated, although they are generally needed.

Specific Embodiment

Figure 1:
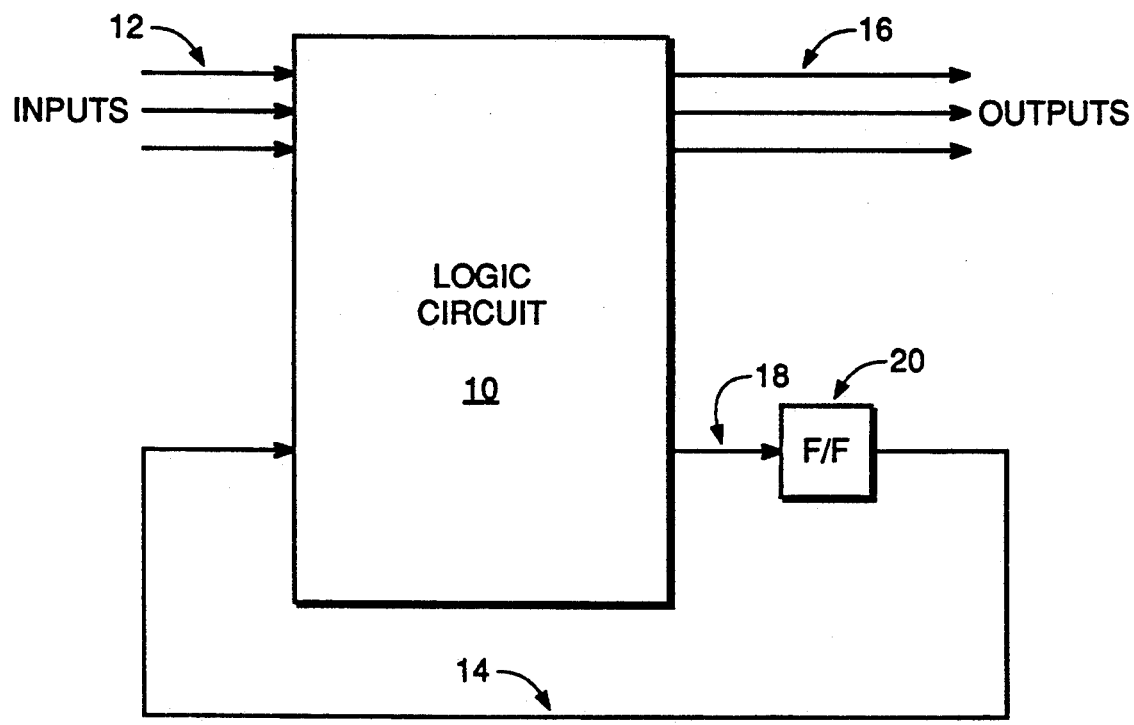
FIG. 1 is a related art illustrating a Mealy machine.
Figure 2:
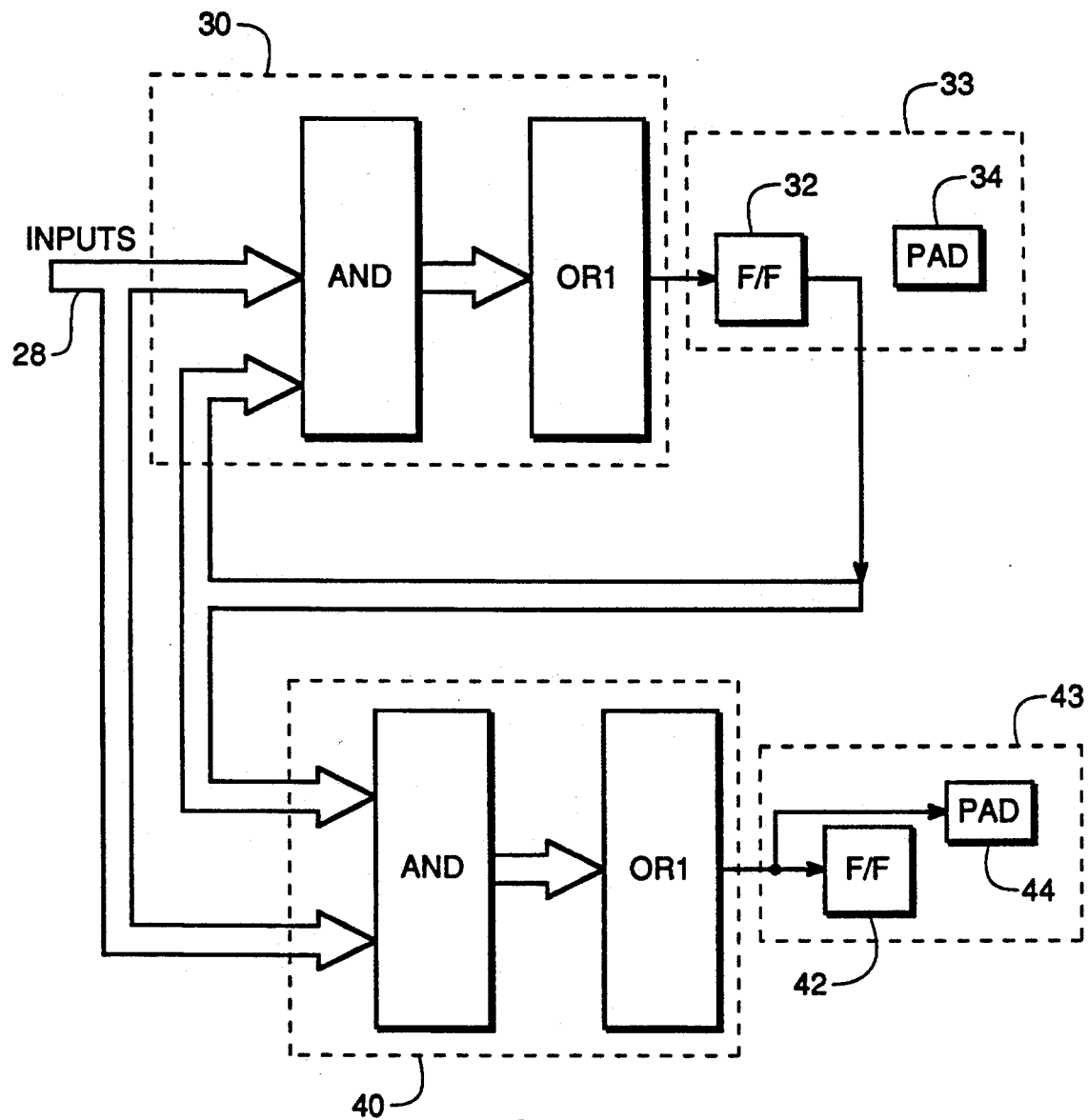
FIG. 2 is a related art illustration showing an implementation of a Mealy machine.
Figure 3:
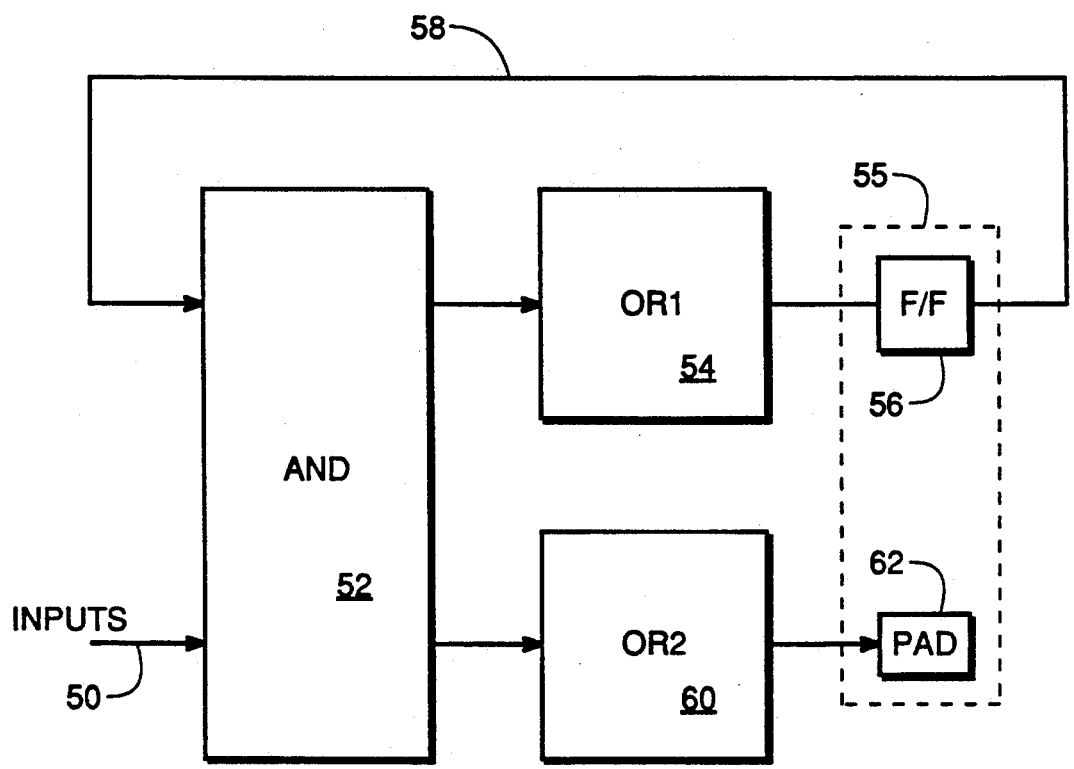
FIG. 3 is an illustration of the present invention showing a Mealy machine configuration.
Figure 4:
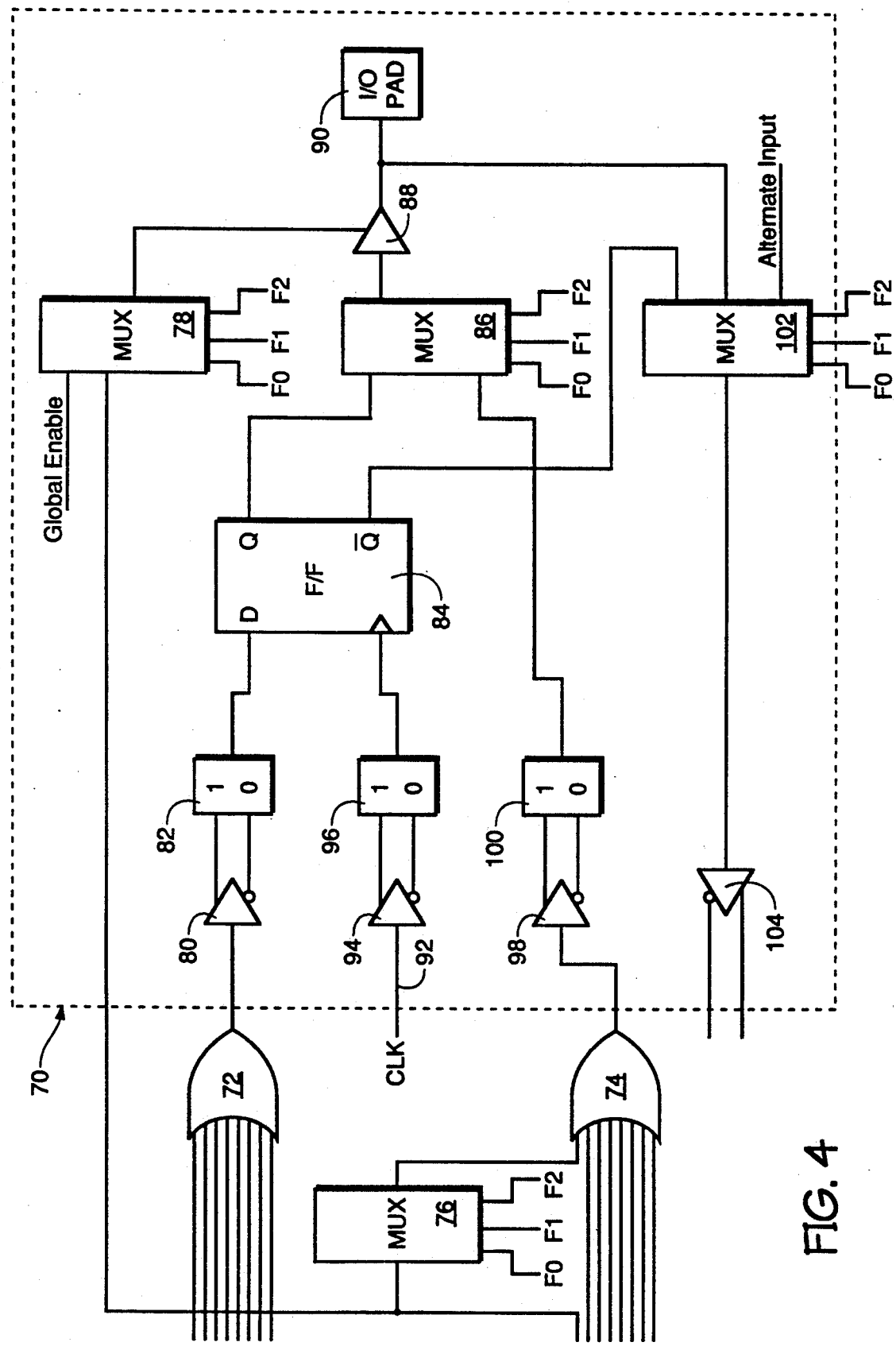
FIG. 4 is a detailed illustration of the invention.
Figure 5A:
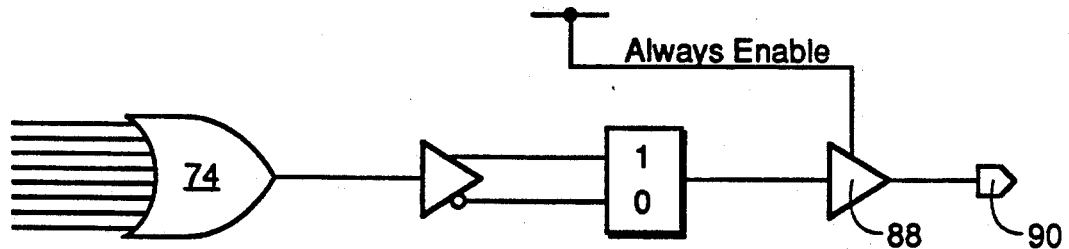
FIGS. 5A-H are a detailed illustrations of the different modes of operation for the invention.
Figure 5B:
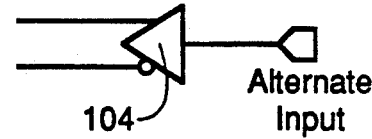
Figure 5B:
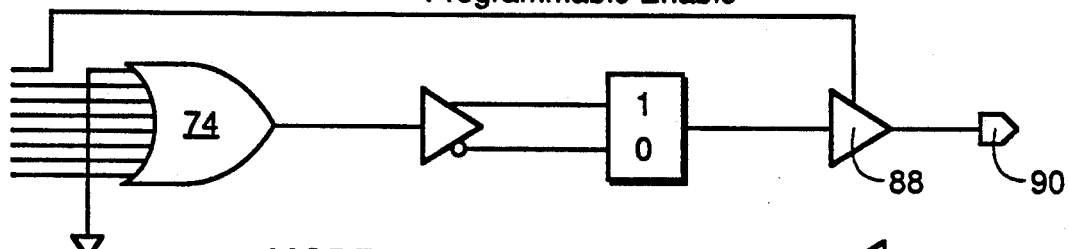
Figure 5C:
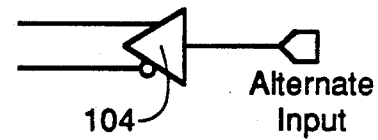
Figure 5C:
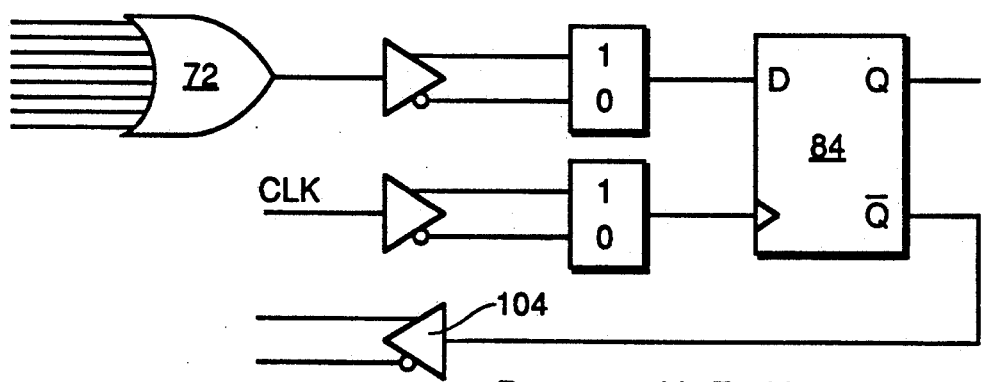
Figure 5C:
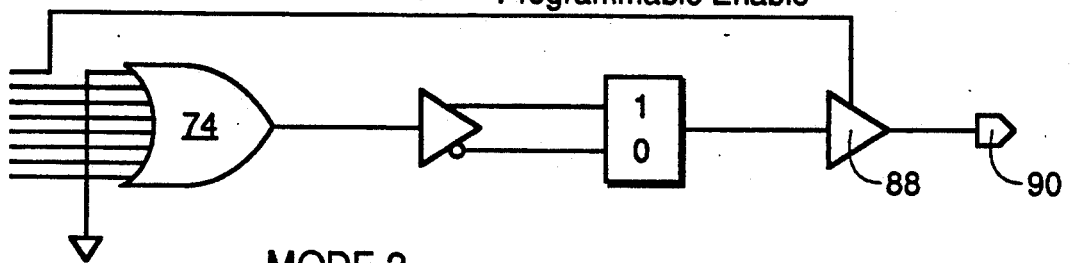
Figure 5D:
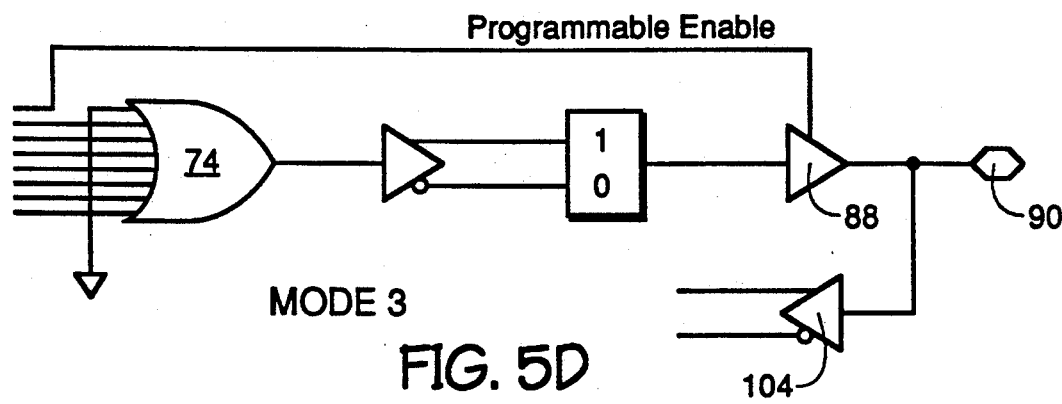
Figure 5E:
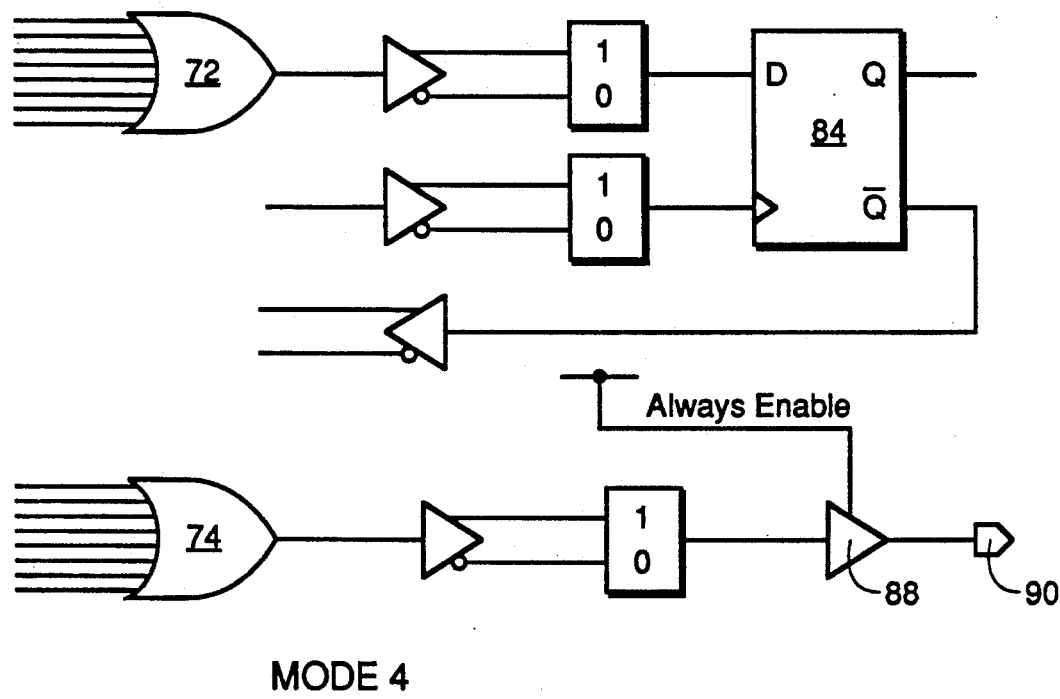
Figure 5F:
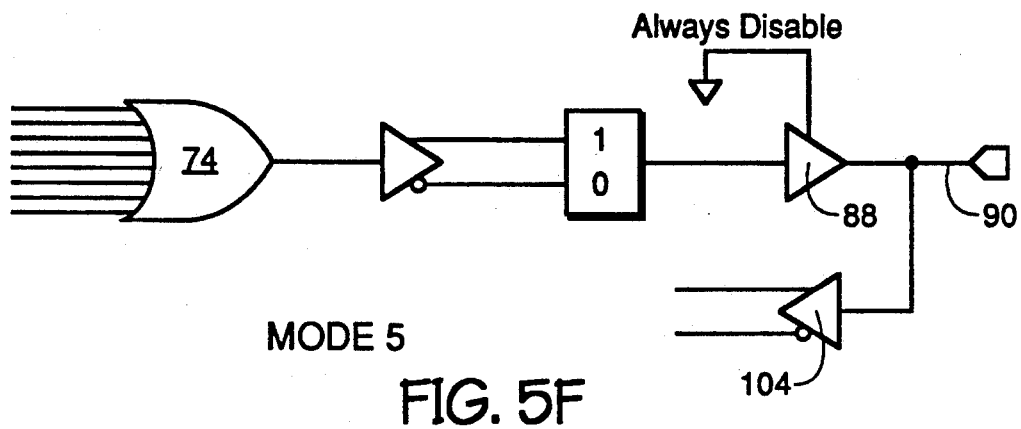
Figure 5G:
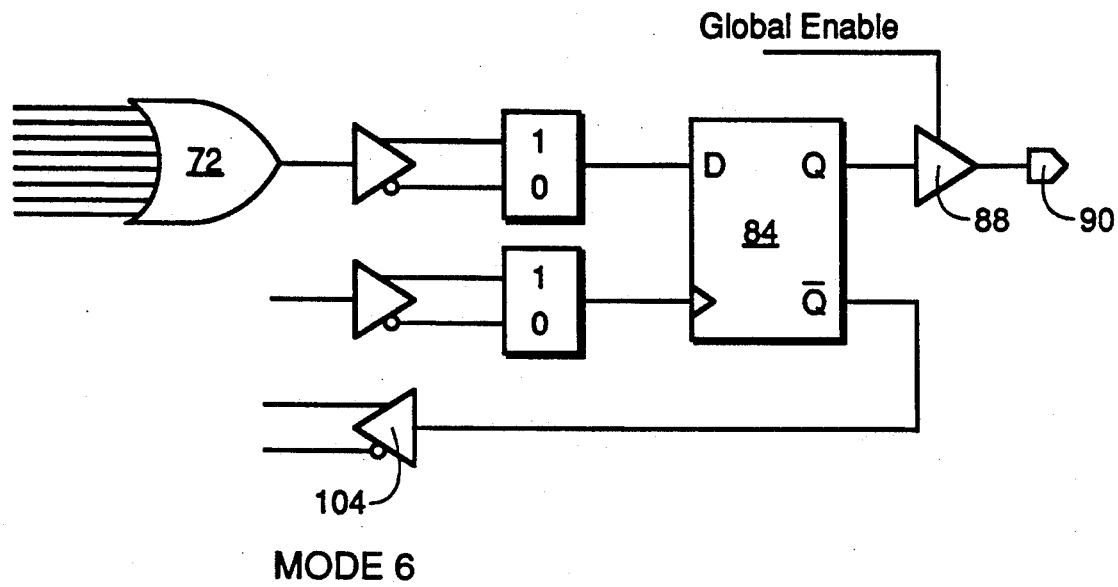
Figure 5H:
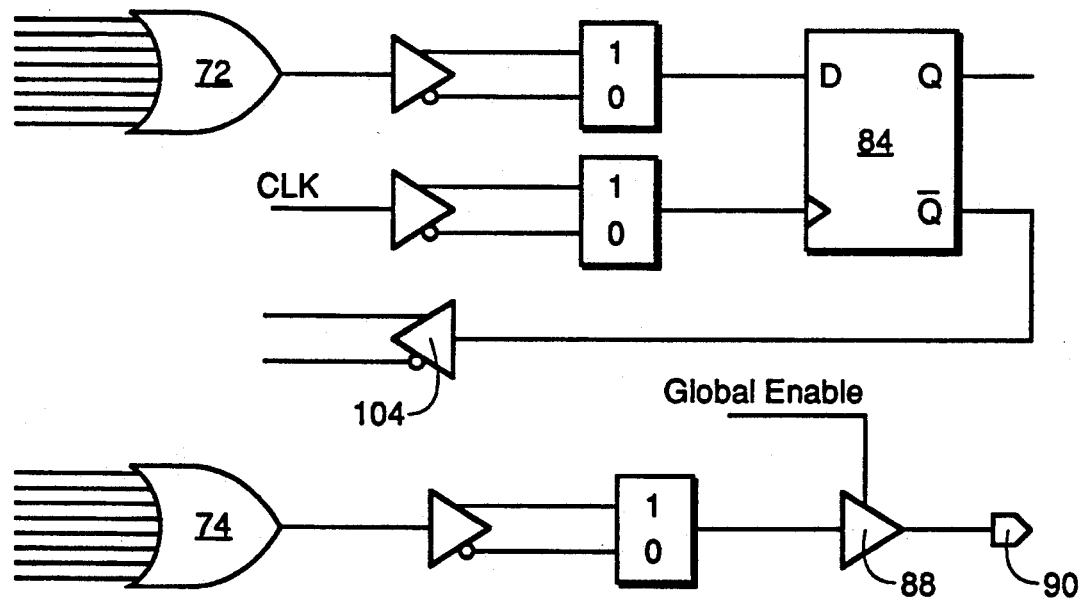

FIG. 4 is a detailed illustration of the invention and includes the following elements: Leading into the macrocell 70 are two OR arrays 72 and 74. Multiplexer 76 takes a product term from OR array 74 to an 8×1 multiplexer 78 having a global enable line. From array 72 there is a buffer 80, multiplexer 82, a D-type flip-flop 84, an 8×1 multiplexer 86, a tri-state 88, and output driver and pad 90. Clock signal 92 is coupled to register 84 via buffer 94 and multiplexer 96. Array 74 couples to multiplexer 86 via buffer 98 and multiplexer 100. An 8×1 multiplexer 102 has inputs from tri-state 88 (functioning as a feedback line and an input line), register 84 via Q bar, and an alternate input, the lone output is an input line to a programmable AND array via buffer 104.

FIGS. 5A-F are illustrations of the different modes of operation provided by the described invention. All element numbers in the mode figures refer to the elements found in FIG. 4. The following chart is a summary features provided by each of the different modes of operation.

| FIG. | Mode | Fuse | OE | Pin | C/R | BR | Fb |
|---|---|---|---|---|---|---|---|
| 5A | 0 | 000 | E | O | C | no | ai |
| 5B | 1 | 001 | L | O | C | no | ai |
| 5C | 2 | 010 | L | O | C | yes | Q* |
| 5D | 3 | 011 | L | I/O | C | no | Ip |
| 5E | 4 | 100 | E | O | C | yes | Q* |
| 5F | 5 | 101 | D | I | — | no | ai |
| 5G | 6 | 110 | G | O | R | no | Q* |
| 5H | 7 | 111 | G | O | C | yes | Q* |

Referring to the preceding chart, the following is an explanation of the symbols: Concerning OE (output enable) to mux 78 controlling tri-state 88: E is enable, L is local, G is global, and D is disable. Concerning Pin (output pin), O and I mean output and input respectively. Concerning C/R (combinatorial/ registered signal from register 84), C is combinatorial, R is registered, and "-" is not applicable. Concerning BR, it means buried registers. Concerning Fb (feedback), ap is alternate input to mux 102, Q* is inverted register output Q, and Ip is input over pad 90. Concerning the fuse column, the listed codes refer to the coding in muxes 78, 86, and 102, used to achieve the corresponding modes.

Figure 6:
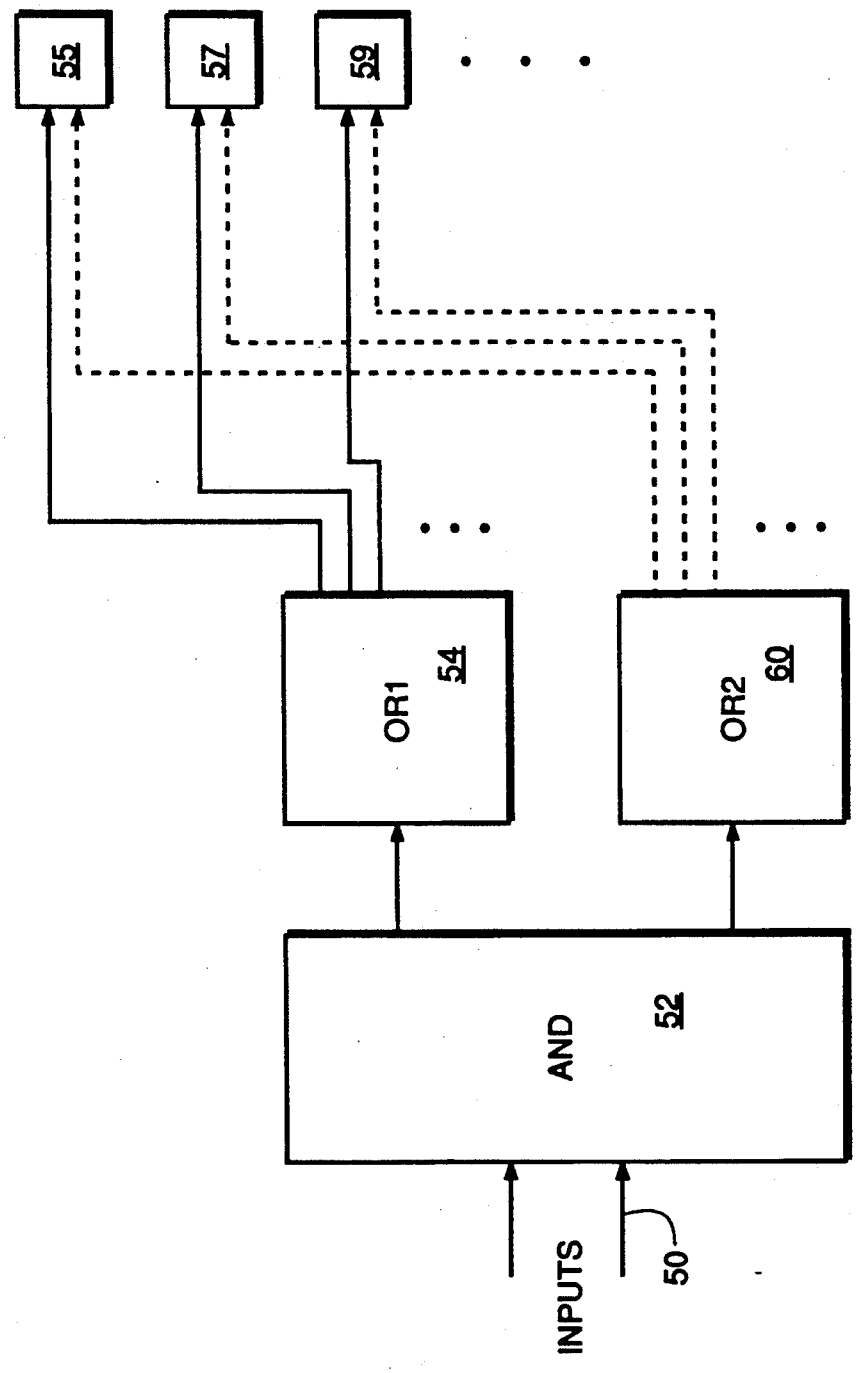
FIG. 6 is an illustration of the present invention showing multiple macrocells receiving one input from the first and second logical OR arrays.

Referring to FIG. 6, there is illustrated the subject PLD overall architecture having the following elements: inputs 50 providing inputs to a programmable and matrix array 52 which in turn provides inputs to two separate logical programmable OR arrays 54 and 60, which in turn provide a single input line each to the macrocells 55, 57, 59 etc.

Advantages in the Invention

One skilled in the art will appreciate the advantage of this macrocell architecture. Specifically, there are two OR arrays inputting to the same macrocell 70 and uniquely proceeding to only one output pad 90.

Moreover, one will notice the efficiencies of the described embodiment upon emulating the desired Mealy machine. Specifically, the first OR array which calculates the current state does not unnecessarily have its own output pad. Additionally, the second OR array which calculates the output signal does not have an unused flip-flop or memory element. Therefore, there is a field programmable logic device which is efficiently designed to emulate a Mealy state machine.

While the invention has been taught with specific reference to one embodiment, someone skilled in the art will recognize that changes can be made in form and detail without departing from the spirit and the scope of the invention.

Although subheadings in the Detailed Description of the Illustrated Embodiment are used, these are merely provided for assisting the reader; wherein, the writer is free to enter any information under any headings.

I claim:

1. A programmable logic device, comprising:
a) a programmable AND array;
b) exclusively a first and second programmable OR array, receiving inputs from the AND array;
c) a macrocell, receiving only a single input from each of the exclusive first and second OR arrays, including:
 a first circuit path receiving a first electrical signal from the first OR array, consisting essentially of:
  a first means for outputting a true and complement signal in response to receiving the first signal;
  second means for receiving the true and complement signals, and for outputting a second signal which is either the true or complement signal;
  register means for receiving the second signal, and for outputting a third signal;
  third means for receiving the second signal and outputting the second signal;
  tri-state means, receiving the second signal from the third means, for controlling the outputting of the third signal, and outputting the second signal; and
  an output pad that receives the second signal from the tri-state means and outputting the second signal outside of the macrocell.

2. The programmable logic device of claim 1, wherein the macrocell, receiving a single input from each of the exclusive first and second OR arrays, further comprising:
 a second circuit path receiving a first electrical signal from the first OR array, consisting essentially of:
  first means, responsive to the first signal, for outputting a true and complement signal, responsive to the first signal;
  second means for receiving the true and complement signals, and for outputting only one of the true or complement signals;
  register means for receiving the output of the second means and outputting a second electrical signal, being a true signal from the register means;
  third means for receiving and outputting the second signal;
  tri-state means, receiving the second signal from the third means, for controlling the outputting of the second signal, and outputting the second signal to an output pad;
  fourth means for also receiving the second signal from the tri-state means and outputting the second signal;
  fifth means for receiving the second signal, from the fourth means, and for outputting a true and complement signal, from the second signal, to the AND array.

3. A programmable logic device, comprising:
a) a programmable AND array;
b) exclusively and the only first and second programmable OR array, receiving inputs from the AND array;
c) a macrocell, receiving only a single input from each of the exclusive first and second OR arrays, including:
 a first circuit path receiving the first electrical signal from a first OR array, consisting essentially of:
  first means for outputting a true and complement signal in response to the received first signal;
  second means for receiving the true and compliment signals and for outputting only one of the true or complement signals;
  register means for receiving the output of the second means, and for outputting a second electrical signal, being a complement signal from the register means;
  third means for receiving the second signal and for outputting a third signal;
  fifth means for receiving the third signal and for outputting a true and complement signal from the third signal to the AND array.

4. A programmable logic device, comprising:
a programmable AND array;
exclusively a first and second programmable OR array, receiving inputs from the AND array;
a macrocell, receiving only two inputs from the OR arrays, a single input from each of the exclusive first and second OR arrays, including:
a) a first circuit path receiving a first electrical signal from the first OR array, consisting essentially of:
 i) first means, responsive to the first signal, for outputting a true and complement signal;
 ii) second means for receiving the true complement signals, and for outputting a second signal being either the true or complement signal;
 iii) register means for receiving the second signal and outputting a third signal;
 iv) third means for receiving the third signal and for outputting the third signal;
 v) tri-state means, for receiving the third signal from the third means, for controlling the outputting of the third signal, and outputting the third signal;
 vi) an output pad for receiving the third signal and outputting the third signal out of the macrocell; and
b) a second circuit path receiving the first electrical signal from the first OR array, consisting essentially of:
 i) first means, responsive to the first signal, for outputting a true and complement signal;
 ii) second means for receiving the true complement signals, and for outputting a second signal being either the true or complement signal;

iii) register means for receiving the second signal and outputting a third signal, being a complement signal from the register means;

iv) third means, responsive to the third signal, for outputting the third signal; and v) fifth means for receiving the fourth signal and outputting a true and complement signal from the fourth signal to the AND array.

5. A programmable logic device, comprising:
a) a programmable AND array;
b) exclusively a first and second programmable OR array, receiving inputs from the AND array;
c) a macrocell, receiving only a single input from each of the exclusive first and second OR arrays, including:
   a first circuit path receiving a first electrical signal from the second OR array, consisting essentially of:
   i) first means, responsive to the first signal, for outputting a true and complement signal responsive to the first signal;
   ii) second means for outputting a second signal responsive to the true or complement signal;
   iii) third means for receiving and outputting the second signal; and
   iv) tri-state means for controlling the outputting of the second signal to an output pad, and outputting the second signal to the output pad.

6. The programmable logic device of claim 5, wherein the macrocell further comprises:
a second circuit path receiving a first electrical signal from the second OR array, consisting essentially of:
   i) first means, responsive to the first signal, for outputting a true and complement signal of the first signal;
   ii) second means, responsive to the true and complement signals, for outputting a second signal which is either the true or complement signal;
   iii) a third means for receiving and outputting the second signal;
   iv) tri-state means, receiving the second signal, for controlling the outputting of the second signal to an output pad, and outputting the second signal to the output pad;
   v) fourth means, responsive to the second signal routed from the tri-state device, for outputting the second signal; and
   vi) fifth means, responsive to the second signal routed from the fourth means, for outputting a true and complement signal, from the second signal, to the AND array.

7. A programmable logic device, comprising:
a programmable AND array;
exclusively a first and second programmable OR array, receiving inputs from the AND array;
a macrocell, receiving only two inputs from the OR arrays, a single input from each of the exclusive first and second OR arrays, including:
a) a first circuit path receiving a first electrical signal from the second OR array, consisting essentially of:
   i) first means, electrically coupled to the first signal, for outputting a true and complement signal in response to the first signal;
   ii) second means, electrically coupled to the true and complement signals, for outputting a second signal which is either the true or complement signal; and
   iii) third means for receiving and outputting the second signal;
   iv) tri-state means for controlling the outputting of the second signal to an output pad and outputting the second signal to the output pad; and
b) a second circuit path receiving the first electrical signal from the first OR array; consisting essentially of:
   i) first means, electrically coupled to the first electrical signal, for outputting a true and complement signal in response to the first signal;
   ii) second means, electrically coupled to the true and complement signals, for outputting a second signal which is either the true or complement signal;
   iii) register means for receiving the output of the second means, and for outputting a third electrical signal, being a complement signal from the register means,
   iv) fourth means, for receiving the output of the register means and for outputting the third signal to a fifth means for outputting a true and complement signal from the third signal to the AND array.

8. A programmable logic device, comprising:
a programmable AND array;
exclusively a first and second programmable OR array, receiving inputs from the AND array;
a macrocell, receiving only a single input from each of the exclusive first and second OR arrays, including:
a) a first circuit path receiving a first electrical signal from the second OR array, consisting essentially of:
   i) first means, responsive to the first signal, for outputting a true and complement signal responsive to the first signal;
   ii) second means for outputting a second signal responsive to the true or complement signal;
   iii) third means for receiving and outputting the second signal; and
   iv) tri-state means for controlling the outputting of the second signal to an output pad, and outputting the second signal to the output pad; and
b) a second circuit path receiving the first electrical signal from the first OR array, consisting essentially of:
   i) first means, responsive to the first signal, for outputting a true and complement signal;
   ii) second means for receiving the true complement signals, and for outputting a second signal being either the true of complement signal;
   iii) register means for receiving the second signal and outputting a third signal, being a complement signal from the register means;
   iv) third means, responsive to the third signal, for outputting the third signal; and
   v) fifth means for receiving the fourth signal and outputting a true and complement signal from the fourth signal to the AND array.

9. A programmable logic device, comprising:
a programmable AND array;
exclusively a first and second programmable OR array, receiving inputs from the AND array;

a macrocell, receiving only a single input from each of the exclusive first and second OR arrays, including:
a circuit path receiving a first electrical signal from the second OR array, consisting essentially of:
 i) first means, responsive to the first signal, for outputting a true and complement signal responsive to the first signal;
 ii) second means for outputting a second signal responsive to the true or complement signal;
 iii) third means for receiving and outputting the second signal; and
 iv) tri-state means for controlling the outputting of the second signal to an output pad, and outputting the second signal to the output pad; and
b) a second circuit path receiving a first electronic signal from an alternate input, consisting essentially of
 i) an alternate input line;
 ii) first means for receiving the first signal, and for outputting the first signal; and
 iii) second means for receiving the first signal from the first means and for generating a true and complement signal from the first signal, and for outputting the generated signals to the AND array.

10. An integrated circuit, comprising:
a) a programmable logic device including: input lines;
 a first programmable matrix, coupling the input lines; a plurality of logical AND gates, coupling to the outputs of the programmable matrix;
 a first and second plurality of logical OR gates;
 a second programmable matrix, coupling the outputs of the logical AND gates to the inputs of the first plurality of logical OR gates;
 a third programmable matrix, coupling the outputs of the logical AND gates to the inputs of the second plurality of logical OR gates;
b) a plurality of macrocells, wherein each macrocell is coupled to only a single one output from each of the first and second logical OR gates, and each macrocell further includes:
 a memory element, exclusively electrically coupled to the first logical OR gates input;
 multiplexing means, electrically coupled to both the first and second logical OR gates single outputs, for outputting either the first or second logical OR gates single signal output of each macrocell.

11. The integrated circuit of claim 10, further comprising:
a complement signal generated by the memory element, electrically responsive to the single first OR array signal
routing means for simultaneously routing the multiplexing means outputted signal;
alternate input means for inputting an alternate input to the macrocell;
multiplexer means for receiving three signals; one signal from each of the alternate input means, the routing means, and the complement signal, and thereby directing only one of the three signals back to the programmable AND array.

* * * * *